United States Patent [19]

Seabaugh et al.

[11] Patent Number: 5,512,764
[45] Date of Patent: Apr. 30, 1996

[54] COUPLED-QUANTUM-WELL FIELD-EFFECT RESONANT TUNNELING TRANSISTOR FOR MULTI-VALUED LOGIC/MEMORY APPLICATIONS

[75] Inventors: Alan C. Seabaugh, Richardson, Tex.; Chad H. Mikkelson, Cambridge, Mass.; Gary Frazier, Garland, Tex.

[73] Assignee: Texas Instruments Incorporated, Dallas, Tex.

[21] Appl. No.: 368,251

[22] Filed: Jan. 3, 1995

Related U.S. Application Data

[63] Continuation of Ser. No. 40,037, Mar. 31, 1993, abandoned.
[51] Int. Cl.[6] ........................ H01L 29/06; H01L 31/0328
[52] U.S. Cl. ........................ 257/25; 257/195; 257/263
[58] Field of Search ........................ 257/25, 195, 263

[56] References Cited

U.S. PATENT DOCUMENTS 5,428,224  6/1995  Hayashi et al. ........................ 257/25

FOREIGN PATENT DOCUMENTS 0135965  2/1989  Japan ........................ 257/25

OTHER PUBLICATIONS

Resonant Tunneling Transistors, A. C. Seabaugh, et al., CRL, Texas Instruments, *OSA Proceedings on Ultrafast electronics and Optoelectronics*, ('93), San Francisco, Jan. 25–27, 1993.

*Primary Examiner*—Mark V. Prenty
*Attorney, Agent, or Firm*—Ruben C. DeLeon; James C. Kesterson; Richard L. Donaldson

[57] ABSTRACT

This is a vertical field-effect resonant tunneling transistor device comprising: a semi-conducting substrate 46; a drain region 48 above the semi-conducting substrate; a multiple-barrier multi-well resonant tunneling diode 52, 54, 56, 58, 60 above the drain layer; a two dimensional electron gas heterostructure 64 above the multiple-barrier multi-well resonant tunneling diode; a source region 72 extending through the two dimensional electron gas and above the multiple-barrier multi-well resonant tunneling diode; ohmic contacts 70 on the source region, wherein the source region provides an ohmic connection to the two dimensional electron gas; and gate[s] 68, 74 besides the source region.

39 Claims, 6 Drawing Sheets and gate[s] besides the
COUPLED-QUANTUM-WELL FIELD-EFFECT RESONANT TUNNELING TRANSISTOR FOR MULTI-VALUED LOGIC/MEMORY APPLICATIONS This application is a continuation of application Ser. No. 08/040,037, filed Mar. 31, 1993, now abandoned.

FIELD OF THE INVENTION

This invention generally relates to vertical field-effect resonant tunneling transistors and their use as logic/memory components.

BACKGROUND OF THE INVENTION

Without limiting the scope of the invention, its background is described in connection with multi-valued logic/memory applications, as an example.

Integrated circuits have become the technology of choice for performing electronic functions. The downscaling of minimum device geometries has provided for increases in the functional density of electronic circuits. Nanoelectronic devices allow for the continuing increase in functional density of integrated electronic systems beyond the currently perceived limits for conventional electron devices. The term "nanoelectronics" refers to an integrated circuit technology that permits downscaling of minimum circuit geometries to an order of 0.01 micrometers.

In nanoelectronics, the behavior of electrons in semiconductors can be understood by considering the wave-like properties of electrons. Two important electron quantum phenomena that can be observed are "tunneling", whereby electrons pass through potential energy barriers, and "resonance", whereby steady state tunneling current is substantially reinforced because of the material properties and dimensions of quantized regions through which electrons tunnel. Tunneling and resonance are observed when certain quantum states between adjacent regions are simulatneously aligned in energy.

SUMMARY OF THE INVENTION

For future electronic systems, a compact logic technology is needed for operation at room temperature in dense, locally-interconnected arrays. In this architecture, each cell in the array must have low power dissipation and high switching speed. Further, it is desired that the cell have an internal memory capability and unipolar device structure to allow for programmability and maximum device scaling ability. All of these attributes are obtained in the invention.

Generally, and in one form of the invention, a vertical field-effect resonant tunneling transistor (RTT) is demonstrated consisting of a triple-barrier, double-well resonant tunneling diode (3bRTD) which can be depleted by the action of side gates. The 3bRTD features a double peak current-voltage (I–V) characteristic in which the second valley current is comparable to the first valley current. Combination of the resonant tunneling transistor and a constant current load is shown to yield both binary and ternary logic and memory functions.

This vertical field effect resonant tunneling transistor utilizes a triple barrier resonant tunneling diode. The triple barrier resonant tunneling structure must have comparable peak and valley currents for the two resonances when used in logic applications.

The invention has high peak to valley current ratios, and more importantly the ability to modulate the current valleys and peaks above and below the load lines. In this respect the most important characteristics are large modulation due to gate voltage and similar magnitude in the values of the peak and valley currents. Enhancement mode logic levels are advantageous to avoid the need for level-shifting between stages, however, depletion mode logic levels may also be used with the invention and are used in this description.

The vertical field-effect resonant tunneling transistor device comprising: a semi-conducting substrate; a first source/drain region above the semi-conducting substrate; a multiple-barrier multi-well resonant tunneling diode above the first source/drain layer; a two dimensional electron gas (2deg) heterostructure above the multiple-barrier multi-well resonant tunneling diode; a second drain region extending through the two dimensional electron gas and above the multiple-barrier multi-well resonant tunneling diode; ohmic contacts on the second source/drain region, wherein the second source/drain region provides an ohmic connection to the two dimensional electron gas; and gate[s] besides the second source/drain region.

This is a vertical field-effect resonant tunneling transistor device comprising: a semi-conducting substrate; a drain region above the semi-conducting substrate; a multiple-barrier multi-well resonant tunneling diode above the drain layer; a two dimensional electron gas heterostructure above the multiple-barrier multi-well resonant tunneling diode; a source region extending through the two dimensional electron gas and above the multiple-barrier multi-well resonant tunneling diode; ohmic contacts on the source region, wherein the source region provides an ohmic connection to the two dimensional electron gas; and gate[s] besides the source region.

Additional information concerning our invention and its background can be found: Chad H. Mikkelson, et al, "Coupled-Quantum-Well Field-Effect Resonant Tunneling Transistor for Multi-Valued Logic/Memory Applications".

Further advantages of this invention, its nature and various characteristics will be more apparent upon consideration of the attached drawings and following detailed description of the invention.

BRIEF DESCRIPTION OF THE DRAWINGS

The foregoing and further aspects of the invention are illustrated in the accompanying drawings wherein like elements are denoted by like reference designators and in which.

The drawings are schematic and the vertical has been exaggerated for clarity.

DETAILED DESCRIPTION OF PREFERRED EMBODIMENTS

Figure 1:
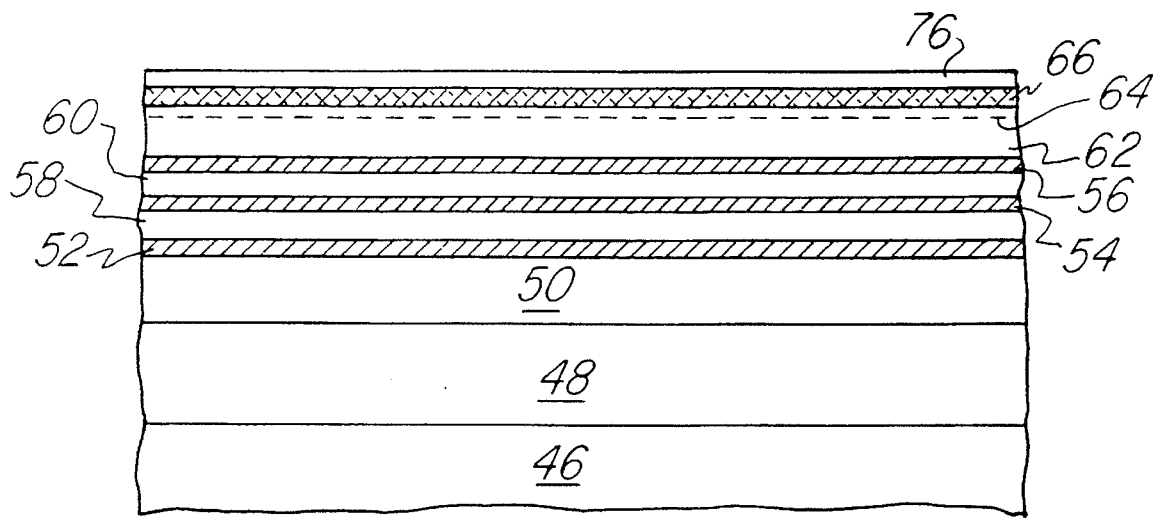
FIG. 1 is a cross sectional elevation view of an intermediate step of the preferred embodiment.

In FIG. 1, a layer of n+ doped InGaAs 48 is on grown on top of an Fe doped InP substrate 46. InGaAs 48 acts as the drain layer. All layers are grown by a growth technique such as molecular beam epitaxy (MBE) or metalorganic MBE (MOMBE). A n– InGaAs layer 50, with a doping density of $2 \times 10^{16}$, is grown next followed by a growth of the first AlAs barrier 52. The first quantum well 58 is grown on top of the first barrier 52. The quantum well 58 consists a lattice-matched $In_{0.53}Ga_{0.47}As$ well. The second barrier 54 is also grown by MBE out of AlAs. The second quantum well 60 is grown on top of the second barrier 54. The quantum well 60 consists of a lattice-matched $In_{0.53}Ga_{0.47}As$ well and an InAs subwell layer. The third barrier 56 is also grown by MBE out of pseudomorphic AlAs. An $InP/In_{0.53}Ga_{0.47}As$ two dimensional electron gas (2deg) 64 layer is formed at the interface between a 40 nm InP layer 66 and a 50 nm InGaAs layer 62. The InP layer 66 is comprised of a 5 nm InP spacer, a 5 nm n+ InP modulation doped layer of $3 \times 10^{18}$ $cm^{-3}$ and a 30 nm undoped InP layer 66. The top layer 76 is 40 nm n-type InGaAs $5 \times 10^{18}$ $cm^{-3}$. Based on comparable calibration structures, the $In_{0.53}Ga_{0.47}As$ 2deg has a sheet density of approximately $7.5 \times 10^{11}$ $cm^{-2}$ ($4.5 \times 10^{11}$) and a mobility of 7450 $cm^2/Vs$ (53k) at 300K (77).

Figure 2:
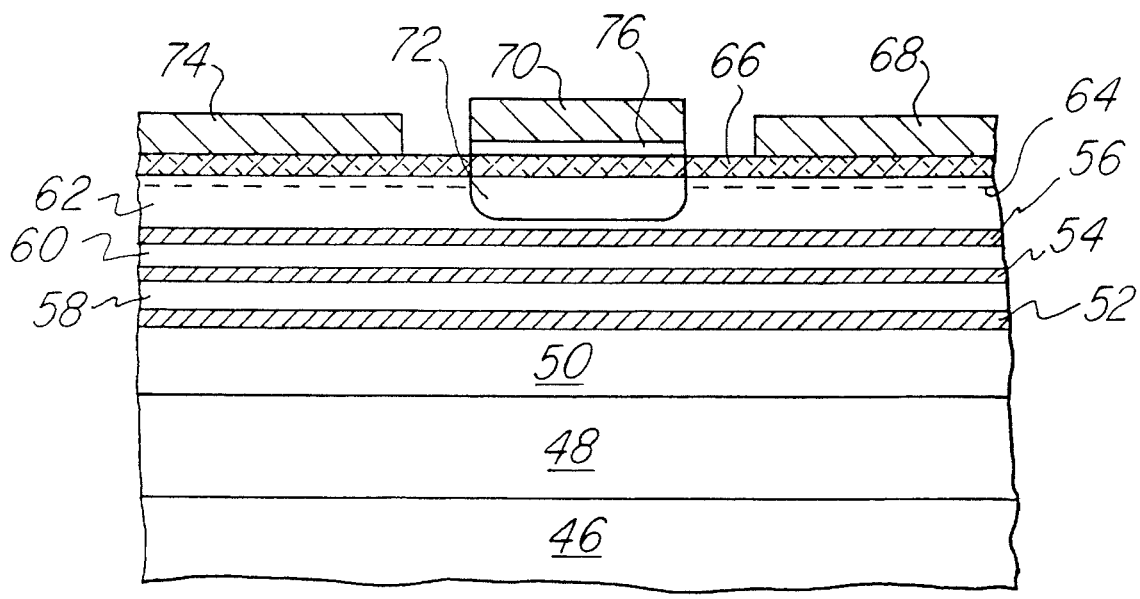
FIG. 2 is a cross sectional elevation view of the first preferred embodiment.

The first preferred embodiment is shown in FIG. 2. All the elements in FIG. 1 are shown again. In addition, the metal gates 68 and 74 are shown on top of the InP layer 66, formed after removal of selected regions of layer 76. The source 70 also consists of metal. The n-type ohmic contact diffusion area 72 is directly below the source. Suitable shallow ohmic contacts can be formed using 50 nm Pd and 120 nm Ge evaporated onto the top InGaAs surface and annealed at 420 C. Transmission electron microscopy of this annealed contact deposited on the top surface shows that penetration of metal is less than 15 nm with no spiking into the top undoped InP layer.

Figure 3:
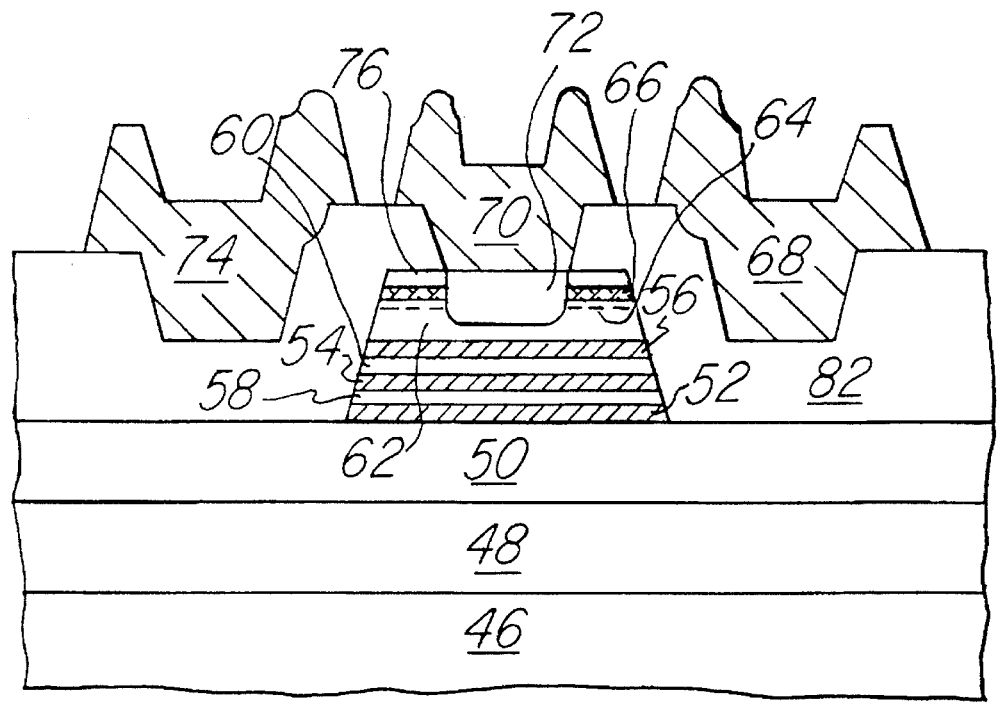
FIG. 3 is a cross sectional elevation view of the second preferred embodiment.

The second preferred embodiment is shown in FIG. 3. The elements in FIG. 1 are also reproduced in this figure. A mesa structure is formed by a wet-chemical or dry etching process to remove the epitaxial layer 76 through 52 from selected areas. An epitaxial regrowth of a wide bandgap semiconductor layer 82 such as InP or InAlAs is then utilized to conformally overgrow the mesa. This overgrowth can be achieved by MBE, or MOMBE, or other vapor phase techniques such as metalorganic vapor phase epitaxy. Following the overgrowth, the layer 82 is etched selectively from the top of the mesa to allow metallization 70 and contact diffusion 72. A n-type ohmic contact diffusion 72 is again shown to connect top source metallization 70 to the 2deg 64. The gate contacts 68 and 74 are formed by recess etching into the overgrown InP layer 82 and evaporating Ti/Pt/Au Schottky contacts. A nonalloyed ohmic Ti/Pt/Au drain contact (not shown) is formed following a wet chemical etch through the triple barrier structure to the lower $5 \times 10^{18}$ $cm^{-3}$ n+ InGaAs layer 48.

Figure 4:
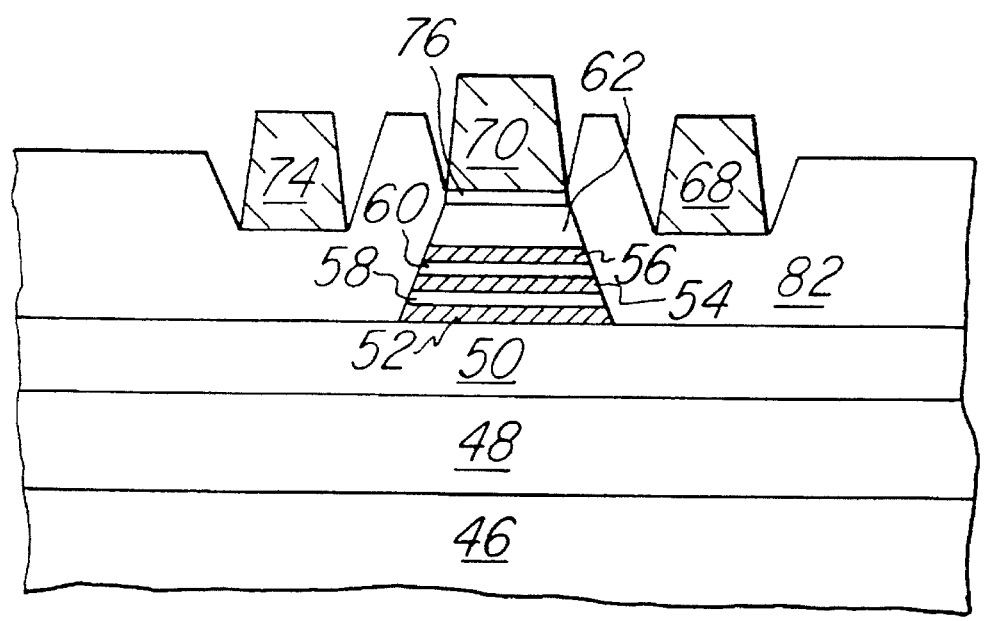
FIG. 4 is a cross sectional elevation of the third preferred embodiment.

A third preferred embodiment is shown in FIG. 4. When the mesa width is comparable in diameter or length to the depletion length formed laterally between regrown layer 82 and the undoped semiconductor mesa layers, it is possible to obtain the same device function without the 2deg layers 64 and 76. This condition is applicable for mesa sizes below one micrometer in width or diameter. Formation of this structure is made analogous to the second embodiment except that the n-type ohmic source contact need not necessarily be diffused. A nonalloyed or in situ deposition of metal is sufficient to make ohmic connection to the n+ InGaAs layer 76.

Figure 5B:
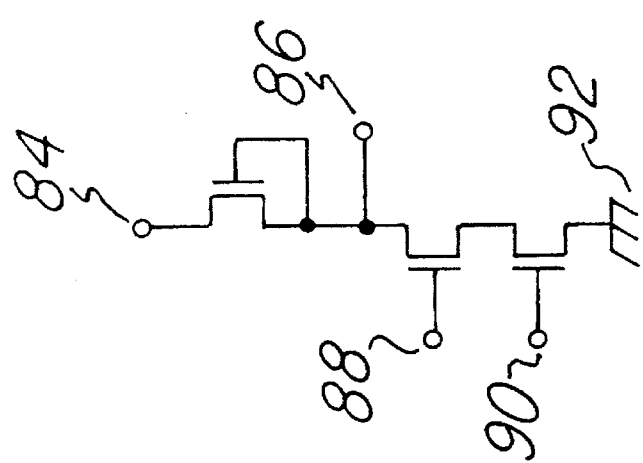
FIG. 5B is a circuit diagram of the invention.
Figure 5A:
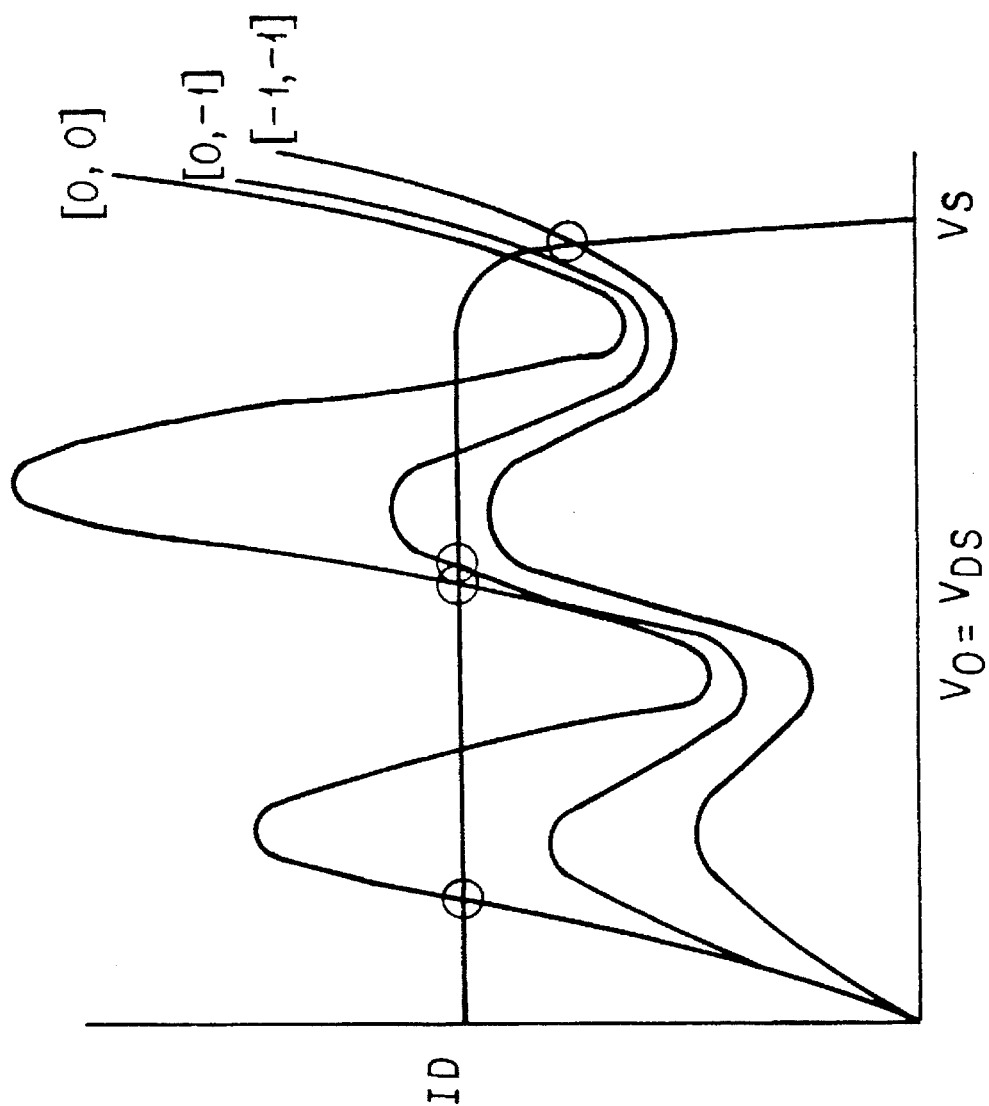
FIG. 5A is a I–V characteristic chart of the invention.

FIG. 5A shows a schematic current-voltage (I–V) characteristic of such an RTT, along with a circuit diagram of a ternary memory cell using depletion mode logic levels. Referring to the circuit diagram FIG. 5B, the circuit consists of: voltage source terminal 84, output voltage terminal 86, a coupled-quantum well field-effect resonant tunneling transistor with two gates 88 and 90 and ground 92. A high current dual peak I–V characteristic is obtained with both gates 88 and 90 biased at 0V with respect to the source. Application of a fixed negative bias (depletion mode) that is sufficient to deplete the 2deg (defined as –1V) will decrease the current cross section of the device by an amount approximately equal to the area under the gate (e.g. under gate 68 of FIG. 2). Thus, in a dual gate configuration, application of [0,–1] and [1,0] bias voltages to gates [88,90] respectively, results in the same I–V characteristic. If the 2degs under both gates 88 and 90 are depleted, [–1,–1], the current cross section of the device is restricted to approximately the area under the source electrode. To obtain the greatest current modulation requires the use of a source contact on the order of one micrometer in length such that the lateral depletion under the gates is sufficient to substantially deplete the area under the source. When electrical power is applied to the circuit, the output voltage 86 is low, indicated by the intersections of the [0,0] 3bRTD characteristic with the FET load line at the circled point preceding the first resonance peak. An intermediate logic level is obtained by application of a [0,–1] or [–1,0] bias voltage pattern and the high output voltage state occurs for [–1,–1] voltage biases. Thus, the output voltage displays one of three different output levels corresponding to the highest previous sum of the two binary gate inputs, i.e. binary to ternary conversion. Digital-to-analog conversion is possible if the device heterostructure is modified to provide additional resonance peaks, and additional gate inputs are added. If only a single annular gate input is used, the output node, retains the value essentially of the previous highest ternary logic level.

Figure 6:
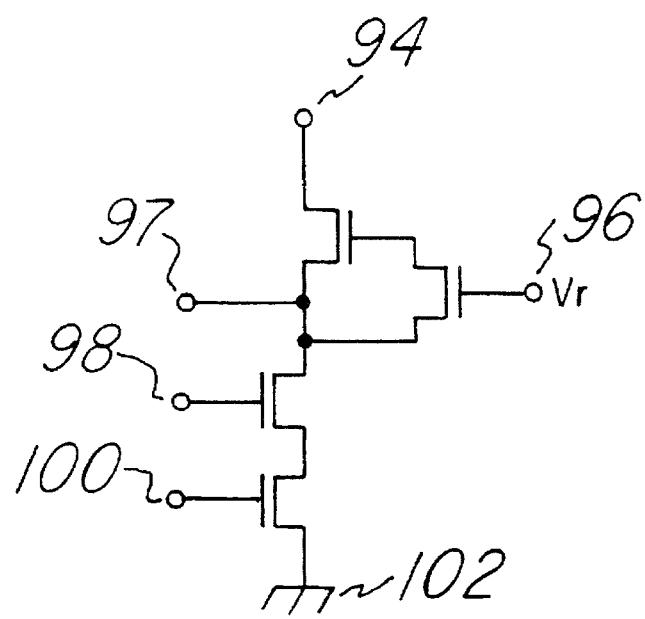
FIG. 6 is a circuit diagram of the invention with a reset.

A circuit that provides a set/reset function is shown in FIG. 6. The circuit consists of: voltage source terminal 94, reset (Vr) terminal 96, output voltage terminal 97, gates 98 and 100 of the RTT, and the ground 102. The reset 96 has two FliTs connected to it. To reset the circuit, applying $V_r$ decreases the load line (e.g. below the lowest valley of FIG. 5A) and causes the RTT to switch to its low voltage state.

Figure 7E:
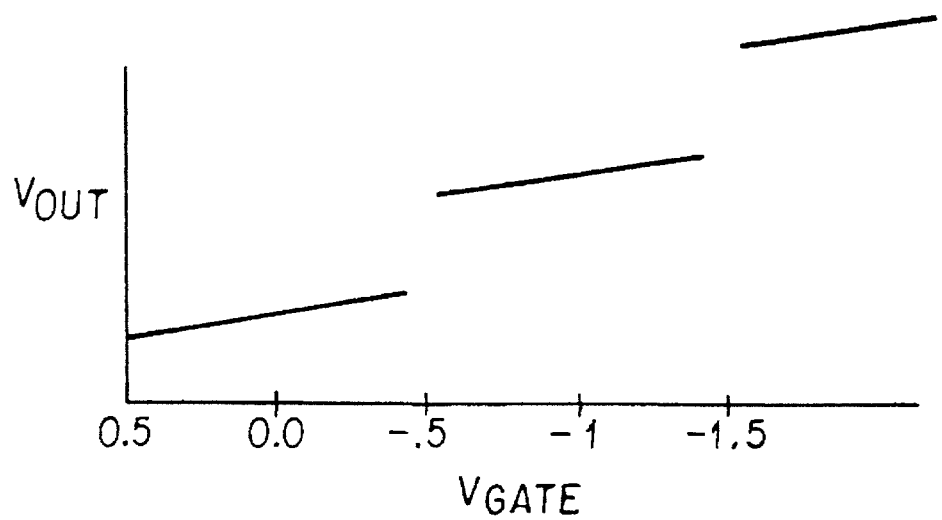
FIGS. 7A–7E are a series of schematic charts of the voltage characteristics of the invention used as a ternary gate with no reset.
Figure 7A:
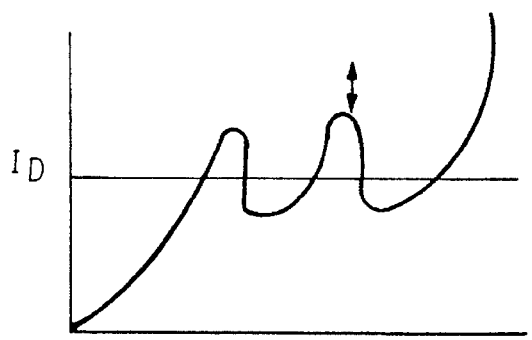
Figure 7B:
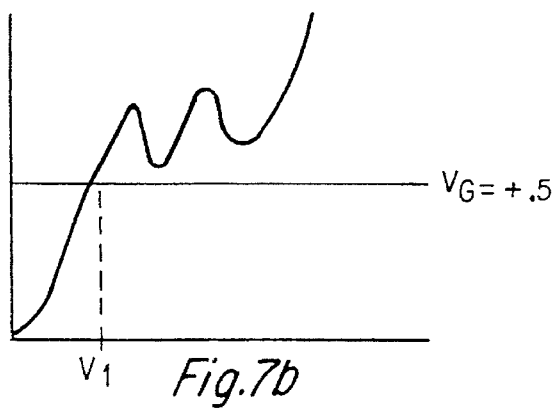
Figure 7C:
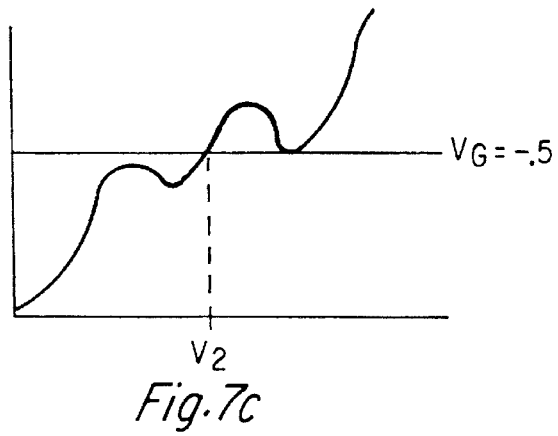
Figure 7D:
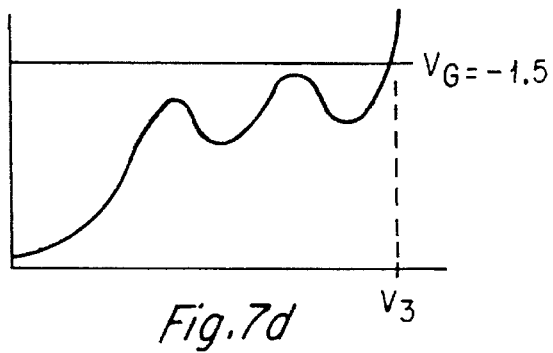

In FIG. 7A–E, a series of schematic charts of the voltage characteristics are shown. The charts are characteristic of the invention used in either a ternary memory cell or a ternary gate with no external reset circuit required. FIG. 7A shows a representative I–V characteristic and constant current load line indicated by a horizontal dashed line. When the first two peaks are similar in magnitude, a switch in states is possible using just the gate voltages. FIGS. 7B, 7C and 7D are I–V characteristics when $V_G=+0.5$, $V_G=-0.5$ and $V_G=-1.5$, volts, respectively. FIG. 7E shows the dependence of the voltage at terminal 86 in FIG. 5B on the gate voltage 88 and/or 90 in FIG. 5B for VG values of 0.5 through –1.5 volts. For these device I–V characteristics, the output value varies monotonically with gate bias and no external reset is required.

Both the binary AND and OR function can be implemented using a single resonance peak and the circuit of FIG.

Figure 8:
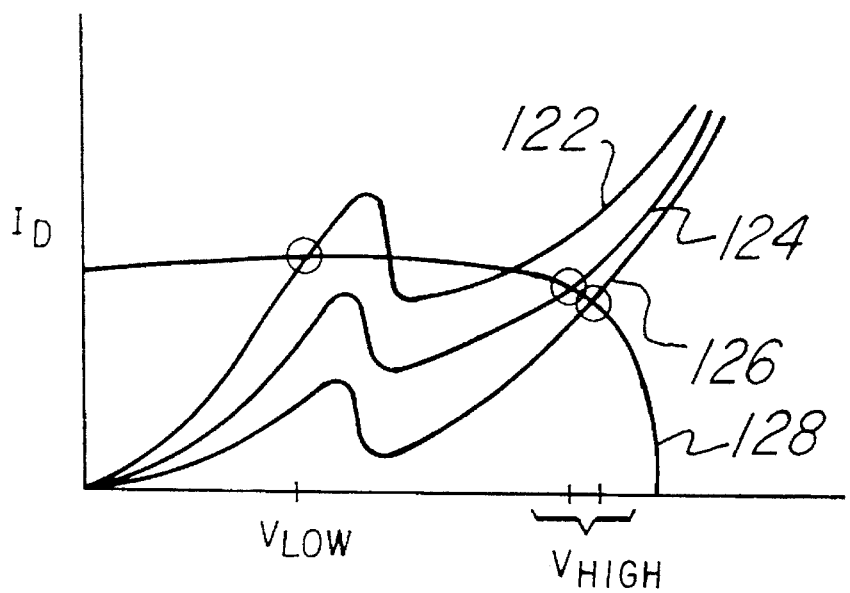
FIG. 8 is a circuit diagram for a logical OR gate.

5B. In FIG. 8, the OR gate I–V characteristic is shown for a device using only one peak device or the first peak of a multi-peak I–V characteristic. Curve 122 represents zero bias. Curve 124 represents when −1 volt is applied to either gate. Curve 126 represents when −1 volt is applied to both gates. The load line 128 is also shown. The application of a negative voltage to any or all of the gates decreases the current of the first peak so it is lower than the load line switching the output to a high state.

Figure 9:
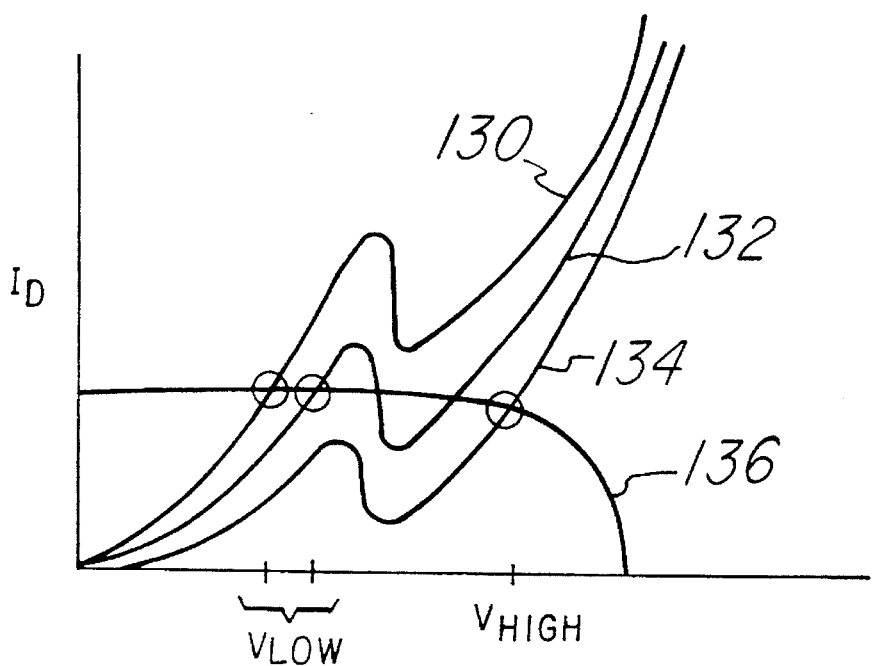
FIG. 9 is a circuit diagram for a logical AND gate.

In FIG. 9, the AND gate I–V characteristic is shown. Curve 130 represents zero bias. Curve 132 represents when −1 volt is applied to either gate. Curve 134 represents when −1 volt is applied to both gates. The load line 136 is also shown. An AND gate configuration is accomplished by decreasing the load line 136 with respect to the load line 128 in FIG. 8. An input of −1 volts, at both input gates switches the device to its high voltage output state.

All other logical input combinations result in a low voltage output. The circuit can be dynamically reconfigured using a circuit such as in FIG. 6. Using the terminal 96 in FIG. 6, the load line can be repositioned to cause the circuit function to change alternately from a condition of providing the logical AND unction, to a condition of providing the logical OR function.

It is to be understood that the embodiments and variations shown and described herein are illustrative of the principles of this invention only and that various modifications may be implemented by those skilled in the art without departing from the scope and spirit of the invention. In particular, the materials, device dimensions, and operating voltages are free parameters which may be varied without departing from the spirit of the invention.

What is claimed is:

1. A resonant tunneling transistor device comprising:
   a semi-conducting substrate;
   a drain region above said semi-conducting substrate;
   a multiple-barrier multi-well resonant tunneling diode above said drain region;
   a two dimensional electron gas heterostructure above said multiple-barrier multi-well resonant tunneling diode;
   a source region, wherein said source region provides an ohmic connection to said two dimensional electron gas;
   contacts on said drain region and said source region; and
   a gate besides said source region.

2. The device of claim 1, wherein said source region extends through said two dimensional electron gas and above said multiple-barrier multi-well resonant tunneling diode.

3. The device of claim 1, wherein said two dimensional electron gas heterostructure consists of $InP/In_{0.53}Ga_{0.47}As$.

4. The device of claim 1, wherein said two dimensional electron gas heterostructure consists of $InyAl_{1-y}As/In_{0.53}Ga_{0.47}As$.

5. The device of claim 1, wherein a second gate is located beside said source region.

6. The device of claim 1, wherein said multiple-barrier multi-well resonant tunneling diode consists of $AlAs/In_xGa_{1-x}As$ heterojunctions.

7. The device of claim 1, wherein said multiple-barrier multi-well resonant tunneling diode is formed in a mesa configuration.

8. The device of claim 1, wherein said semi-conducting substrate consists of Indium-phosphide.

9. The device of claim 1, wherein said device is used for multi-valued logic circuit functions.

10. The device of claim 1, wherein said device is used for logical AND circuit functions.

11. The device of claim 1, wherein said device is used for logical OR circuit functions.

12. The device of claim 1, wherein said device is used as a binary-to-ternary convertor.

13. The device of claim 1, wherein said device is used for analog-to-digital convertor functions.

14. The device of claim 1, wherein said device is used as a ternary memory element.

15. A vertical field-effect resonant tunneling transistor device comprising:
   a semi-conducting substrate;
   a drain region above said semi-conducting substrate;
   a multiple-barrier multi-well resonant tunneling diode above said drain layer;
   a two dimensional electron gas heterostructure above said multiple-barrier multi-well resonant tunneling diode;
   a source region extending through said two dimensional electron gas and above said multiple-barrier multi-well resonant tunneling diode;
   ohmic contacts on said source region, wherein said source region provides an ohmic connection to said two dimensional electron gas; and
   a gate besides said source region.

16. The device of claim 15, wherein a second gate is located beside said source region.

17. The device of claim 15, wherein said two dimensional electron gas heterostructure consists of $Inp/In_{0.53}Ga_{0.47}As$.

18. The device of claim 15, wherein said two dimensional electron gas heterostructure consists of $In_yAl_{1-y}As/In_{0.53}Ga_{0.47}As$.

19. The device of claim 15, wherein said multiple-barrier multi-well resonant tunneling diode consists of $AlAs/In_xGa_{1-x}As$ heterojunctions.

20. The device of claim 15, wherein said multiple-barrier multi-well resonant tunneling diode is formed in a mesa configuration.

21. The device of claim 15, wherein said semi-conducting substrate consists of Indium-phosphide.

22. The device of claim 15, wherein said device is used for multi-valued logic circuit functions.

23. The device of claim 15, wherein said device is used for logical AND circuit functions.

24. The device of claim 15, wherein said device is used for logical OR circuit functions.

25. The device of claim 15, wherein said device is used as a binary-to-ternary convertor.

26. The device of claim 15, wherein said device is used for analog-to-digital convertor functions.

27. The device of claim 15, wherein said device is used as a ternary memory element.

28. A vertical field-effect resonant tunneling transistor device comprising:
   a semi-conducting substrate;
   a drain region above said semi-conducting substrate;
   a triple-barrier double-well resonant tunneling diode above said drain region;
   a two dimensional electron gas heterostructure above said triple-barrier double-well resonant tunneling diode;
   a source region extending through said two dimensional electron gas and above said triple-barrier double-well resonant tunneling diode;

ohmic contacts on said source region, wherein said source region provides an ohmic connection to said two dimensional electron gas; and two gates besides said source region.

29. The device of claim 28, wherein said two dimensional electron gas heterostructure consists of Inp/In$_{0.53}$Ga$_{0.47}$As.

30. The device of claim 28, wherein said two dimensional electron gas heterostructure consists of In$^y$Al$_{1-y}$As/In$_{0.53}$Ga$_{0.47}$As.

31. The device of claim 28, wherein said triple-barrier double-well resonant tunneling diode consists of AlAs/In$_x$Ga$_{1-x}$As heterojunctions.

32. The device of claim 28, wherein said device is used for multi-valued logic circuit functions.

33. The device of claim 28, wherein said semi-conducting substrate consists of Indium-phosphide.

34. The device of claim 28, wherein said triple-barrier double-well remnant tunneling diode is formed in a mesa configuration.

35. The device of claim 28, wherein said device is used for logical AND circuit functions.

36. The device of claim 28, wherein said device is used for logical OR circuit functions.

37. The device of claim 28, wherein said device is used as a binary-to-ternary convertor.

38. The device of claim 28, wherein said device is used for analog-to-digital convertor functions.

39. The device of claim 28, wherein said device is used as a ternary memory element.

\* \* \* \* \*